GATE STRUCTURE FOR INSULATED GATE FIELD EFFECT TRANSISTOR

Filed June 20, 1967 2 Sheets-Sheet 1

INVENTORS H. E. NIGH
J. STACH
S. K. TUNG

BY H. W. Lockhart
ATTORNEY

March 24, 1970 H. E. NIGH ET AL 3,502,950

GATE STRUCTURE FOR INSULATED GATE FIELD EFFECT TRANSISTOR

Filed June 20, 1967 2 Sheets-Sheet 2

United States Patent Office 3,502,950
Patented Mar. 24, 1970

3,502,950

GATE STRUCTURE FOR INSULATED GATE FIELD EFFECT TRANSISTOR

Harold E. Nigh, Hokendauqua, Joseph Stach, Allentown, and Shiu K. Tung, Bethlehem, Pa., assignors to Bell Telephone Laboratories, Incorporated, Murray Hill, N.J., a corporation of New York Filed June 20, 1967, Ser. No. 647,555
Int. Cl. H011 *11/00, 11/14*
U.S. Cl. 317—235 2 Claims

ABSTRACT OF THE DISCLOSURE

Field effect transistors (FET) of the metal-insulator-semiconductor (MIS), also called insulated gate (IGFET), type are fabricated using a gate dielectric film comprising two different materials, one over the other. A particular configuration employs a 1000 angstrom layer of aluminum oxide ($Al_2O_3$) over a 500 angstrom layer of silicon dioxide ($SiO_2$).

Figure 1:
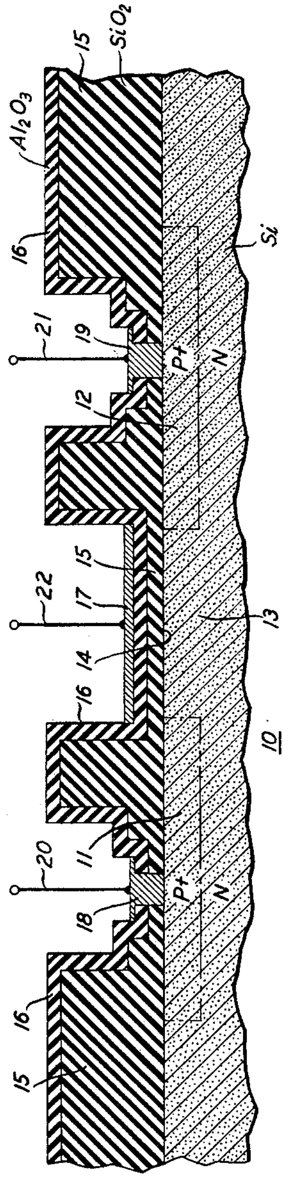

By varying the thickness of the silicon dioxide layer the threshold voltage of the device may be varied to the extent that operation in both the enhancement and depletion modes may be attained. Accordingly, devices of both types may be fabricated on a common substrate for an integrated circuit.

BACKGROUND OF THE INVENTION

The invention relates to semiconductor devices of the field effect transistor type and more particularly to the insulated gate effect type.

Insulated gate field effect transistors comprise a conduction channel of one conductivity type in a body of semiconductor material terminated at one end by a source region and at the other by a drain region both of opposite conductivity type. Conduction through the channel is controlled by voltage applied to the gate which comprises a metal film on the surface adjoining the channel and spaced therefrom by a dielectric film.

Generally, insulated gate field effect transistors operate in the enhancement mode or the depletion mode. Enhancement mode devices exhibit substantially zero current at zero bias voltage but conduct appreciable current under sufficient gate-source bias. Depletion mode devices, on the other hand, have appreciable conduction at zero gate-source bias voltage which is increased by the application of gate-source bias of proper polarity, depending upon the polarity of the conduction carriers.

In general terms the gate voltage required to effect conduction is referred to as the threshold. More specifically and particularly for the purposes of this disclosure, the threshold voltage is defined as the value at which the minority carrier concentration in the channel, that is, the induced channel at the surface, just equals the concentration of majority carriers in the bulk.

For most applications, particularly those in which devices of the insulated gate, field effect type are incorporated in integrated circuits, it is desirable to provide as low a threshold voltage as practicable. Generally, the threshold may be reduced by decreasing the thickness of the dielectric film. This, however, degrades certain other important characteristics of the device and particularly reduces the metal gate electrode to semiconductor substrate breakdown voltage. This type of breakdown renders the device inoperative.

SUMMARY

In accordance with this invention it has been determined that a desirably low value of threshold voltage may be attained an insulated gate field effect device by including over the usual layer of silicon dioxide forming the gate electrode dielectric film, an outer layer of aluminum oxide or an aluminum silicate. Not only does this configuration enable a lower threshold voltage, without degradation of other characteristics, than previously has been attainable, but also the devices are stable to a high degree, retaining their designed characteristics through a wide range of operating conditions and ambients.

Moreover, in another important aspect of the invention it has been found that by using different thicknesses of the underlying silicon dioxide layer different thresholds may be attained even including the range from enhancement mode to depletion mode. Thus, in accordance with the invention, by the simple additional step of selectively thinning the underlying silicon dioxide layer, certain field effect devices in an integrated circuit can be fabricated as depletion mode devices while those with oxide layers of a different thickness are completed an enhancement mode devices. This is an advantageous arrangement inasmuch as the depletion mode device constitutes a better load element.

Figure 3:
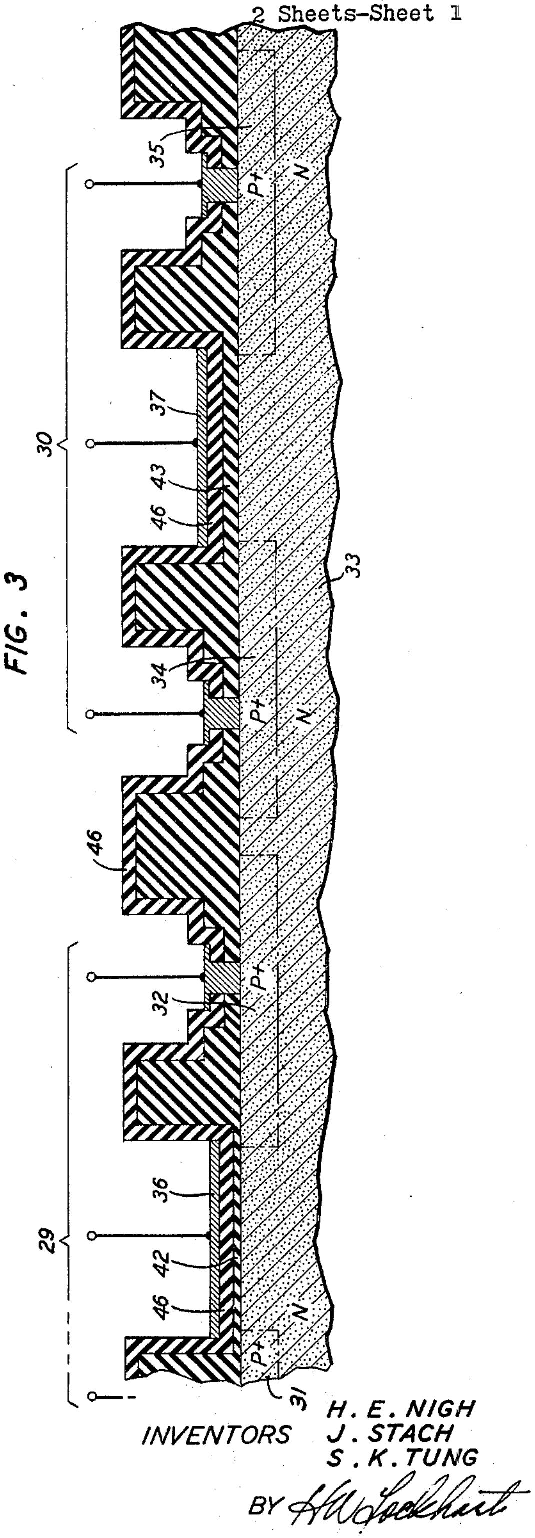
Figure 2:
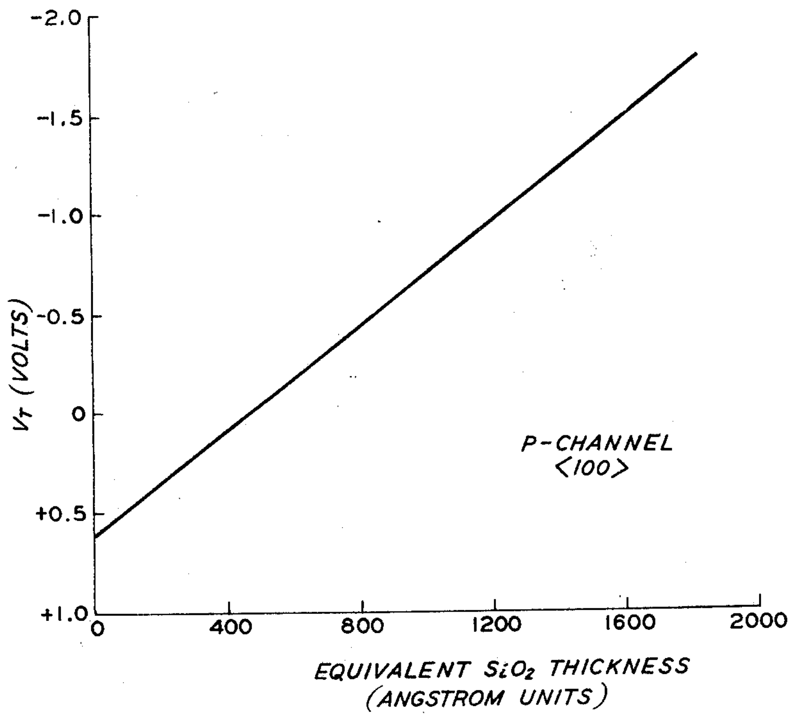

In the drawing, FIG. 1 is a schematic view in cross section of a portion of a semiconductor integrated circuit showing an insulated gate field effect element in accordance with this invention;

FIG. 2 is a graph of threshold voltages for various equivalent thicknesses of the gate double dielectric film; and FIG. 3 is similar to FIG. 1, including however, two elements, one a depletion mode device and the other an enhancement mode in accordance with this invention on the same semiconductor substrate.

In FIG. 1 there is shown in cross section a portion 10 of a semiconductor integrated circuit comprising an insulated gate field effect element. The element is of a conventional and known configuration except for the provision of the double layer of the dielectric film in accordance with this invention. The portion shown includes P-type conductivity zones 11 and 12 constituting the source and drain regions in an N-type conductivity substrate 13. Overlying the channel portion 14 between the source 11 and drain 12 is the gate electrode comprising the double layer dielectric film of silicon dioxide 15 and aluminum oxide 16 and a metal film 17 of titanium and aluminum. Similar metal electrodes 18 and 19 of titanium and aluminum provide ohmic contact to the source and drain regions.

The structure of FIG. 1 is fabricated using well-known planar transistor technology including oxide masking and photoresist techniques, and solid state diffusion. In particular the P-type source and drain regions 11 and 12 are produced by oxide-masked diffusion of a P-type impurity such as boron. The surface then is cleaned and reoxidized thermally, preparatory to the next masking and etching step. A photoresist mask is prepared defining the areas corresponding to the source and drain electrodes 18 and 19, and the gate electrode 17. It is advantageous, for reasons which will become more apparent later in the process description, to etch the source and drain contact areas slightly larger than their final dimensions. The etching of the exposed portions of the silicon dioxide layer using a buffered hydrofluoric acid solution extends through the oxide to the silicon surface.

Next the surface is reoxidized thermally after thorough cleaning. This oxide layer constitutes a part of the completed gate dielectric film and accordingly is grown to the thickness corresponding to the desired threshold voltage. Thus, the thickness of this layer may be from 100 angstroms to about 1000 angstroms. There is an increase, of course, in the thickness of the silicon dioxide layer already present on the silicon surface.

Next a layer of aluminum oxide ($Al_2O_3$) is deposited over the entire surface. This layer is formed to a thickness of between about 300 angstroms and 1000 angstroms by the pyrolysis of aluminum chloride in a carbon dioxide-hydrogen ambient.

The next series of steps in the process relate to the cutting open of the windows for the source and drain electrodes 18 and 19 on the silicon surface. This is done in the manner as generally disclosed in the application of A. A. Bergh and W. van Gelder, Ser. No. 541,173 filed Apr. 8, 1966 and assigned to the same assignee as this application, by first forming a mask using the photoresist technique in a layer of deposited silicon dioxide. Typically, this layer is formed on top of the aluminum oxide layer by the pyrolytic decomposition of silicon tetrachloride with oxygen injection in accordance with well-known techniques. The source and drain contact areas are then etched in this deposited silicon dioxide layer using a buffered hydrofluoric acid solution to expose corresponding portions of the underlying aluminum oxide. The exposed aluminum oxide in turn, is etched using hot phosphoric acid exposing the underlying thermally grown silicon dioxide layer which then is removed using a hydrofluoric acid etchant. The area of these finally etched contact windows is less than that originally opened so that, after metallization, the periphery of the metal contact comprises a thinner silicon oxide layer with an overlayer of aluminum oxide which then forms a seal to the metal electrode without exposing an edge or boundary of the silicon oxide layer. Such edge exposure is a well-known avenue for the penetration of contaminants, particularly sodium atoms.

During the final silicon dioxide etching step, inasmuch as the photoresist mask has been removed, the etchant also quickly removes all of the remaining overlying deposited silicon dioxide layer thus exposing the aluminum oxide surface of the gate dielectric film.

Finally, the device is metallized by vapor deposition using for example, an evaporated layer of titanium followed by aluminum or by deposition of the platinum-titanium-platinum-gold system such as disclosed in Patents 3,287,612 and 3,335,338 to M. P. Lepselter.

The particular metallized areas then are defined by further masking and metal removal steps using appropriate etching. As an alternative method the so-called "back sputtering" techniques such as are disclosed in M. P. Lepselter Patent 3,271,286 or the application of P. A. Byrnes, Jr., and M. P. Lepselter Ser. No. 607,203 filed Jan. 4, 1967 and likewise commonly assigned, may be used.

The external leads 20 and 21 to the source and drain electrodes and lead 22 to the gate are schematic and may be understood typically to be of the beam-lead type described in the aforementioned disclosures of Lepselter.

In connection with the above referred to process for depositing aluminum oxide and aluminum silicates the following descriptions set forth typical embodiments. For aluminum oxide deposition the source material is aluminum chloride ($AlCl_3$) which is a solid having a low vapor pressure at room temperature. Therefore it is vaporized as an aluminum chloride dimer ($Al_2Cl_6$) at an elevated temperature. The gaseous aluminum compound then is diluted with hydrogen as a carrier gas plus a small quantity of carbon dioxide, and delivered to the reaction region close to the silicon dioxide surface. In this connection it is advantageous to maintain the gas line at 30 to 50 degrees centigrade higher than the reaction chamber temperature in order to prevent condensation inside the tubing.

Prior to the deposition process the silicon dioxide surface is etched for about one minute in a buffered hydrofluoric acid solution comprising 15 parts of water to one part commercial grade hydrofluoric acid. The temperature of the reaction chamber is held at about 900 degrees centigrade during the deposition process. A typical mixture comprising .15 percent of gaseous aluminum chloride, 2 percent carbon dioxide and the balance hydrogen, by volume, produces an aluminum oxide film deposition at a rate of about 200 angstroms per minute. The deposition temperature may range from about 750 degrees centigrade to about 1100 degrees centigrade. Generally, lower temperatures result in the presence of more surface states and a lower rate of deposition. Higher temperatures may affect the already diffused PN junctions in the semiconductor body.

For the deposition of aluminum silicates the same general conditions are used with the addition of a quantity of silicon tetrachloride to the gas mixture. Generally, in order to achieve the most advantageous silicate films a mixture of aluminum chloride dimer and silicon tetrachloride in a 50 percent to 50 percent volume ratio is satisfactory. However, satisfactory films are produced using a range of from about as low as 30 percent to as high as 70 percent of the gaseous aluminum compound.

By way of example, devices of the type illustrated in FIG. 1 have been fabricated on single crystal silicon having a (100) crystalline orientation using a 1000 angstrom thick silicon dioxide layer covered by an aluminum oxide layer of the same thickness. The breakdown voltage measured from the gate electrode to the substrate was in excess of 150 volts and the threshold voltage was observed to be about one volt negative. When a similar device was produced with a silicon dioxide layer of 500 angstroms the threshold voltage was 0.6 volt and the breakdown voltage was still in excess of 100 volts. Not only has this arrangement of a double layer gate dielectric yielded low threshold devices but such devices have exhibited a high degree of reproducibility and stability under a variety of operating conditions.

Moreover the change in the threshold level as the effective dielectric thickness is changed renders possible the advantageous arrangement shown in FIG. 3. In this illustration two insulated gate field effect structures 29 and 30 are shown adjoining in an integrated circuit array. As in the device of FIG. 1 the substrate 33 is of N-type conductivity and each device comprises a source and a drain, 31–32 and 34–35, with the intervening space bridged by a gate electrode, 36 and 37, respectively, on the surface therebetween. Device 29 is shown only partially. However, the source region and source electrode are identical in arrangement to that shown for device 30, however, the device 29 includes a silicon dioxide gate dielectric layer 42 having a thickness of less than 500 angstroms while the other device 30 has a silicon dioxide layer 43 of about 1000 angstroms. Both devices otherwise are similar in that the overlying aluminum oxide layer 46 is equal to, or less than, 500 angstroms thick. It should be noted that inasmuch as these devices are majority carrier elements no isolation is required between adjoining elements as is true of minority carrier elements in integrated monolithic circuits. Because of the differences in the silicon dioxide layers of the gate, the two field effect elements 29 and 30 shown in FIG. 3 will have considerably different threshold voltages. The element 30 having the thicker silicon dioxide layer will have a threshold voltage of about one volt negative rendering it an enhancement mode device. The element 29 having the much thinner silicon dioxide layer however will have a threshold voltage of several tenths of a volt positive rendering it a depletion mode device.

A further explanation of this configuration may be had from the graph of FIG. 2 in which threshold voltage is plotted against the dielectric thickness expressed in angstroms of equivalent silicon oxide thickness, that is, the equivalent thickness:

$$t_{eq}=t_{SiO_2}+\frac{K_{SiO_2}}{K_{Al_2O_3}}t_{Al_2O_3}$$

where $K$=dielectric constant and $K_{SiO_2}=3.9$,
$K_{Al_2O_3}=9$.

Accordingly, it is seen that for an equivalent dielectric thickness of something less than about 500 angstroms the threshold voltage will enable operation in the depletion mode. This is a particularly useful arrangement inasmuch as devices of this type are most suitable as load elements.

The structure illustrated in FIG. 3 is achieved in the same general fashion of that of FIG. 1 with the exception that an additional masking and etching step is required to reduce the thickness of the silicon dioxide layer 42 of the element 29 prior to the deposition of the aluminum oxide film. It will be understood that in a given integrated circuit array there may be a considerable number of both enhancement and depletion mode devices so that the additional etching step may be applied to a number of individual elements.

Moreover in addition to the use of aluminum oxide as the overlying dielectric layer, aluminum silicates may be used for this purpose. Generally, the compounds ranging, by mol weight, from 100 percent aluminum oxide ($Al_2O_3$) to about 50 percent $Al_2O_3$ to 50 percent silicon dioxide ($S_1O_2$) have been most useful. These compounds have dielectric constants in the range, of $$3.9<K<9$$

and their sealing properties are comparable to those of aluminum oxide.

Accordingly, although the invention has been disclosed in terms of certain specific embodiments it will be understood that other arrangements may be devised by those skilled in the art which likewise fall within the scope and spirit of the invention.

In particular, although the specific embodiment is in terms of a P-channel device having P-type conductivity source and drain and an N-type substrate the invention is equally applicable to an N-channel device having a P-type substrate and N-type source and drain regions. Reversal of conductivity type will occasion a reversal of polarity of applied voltages. Moreover, it is to be understood that the invention may be applied also to other semiconductor materials such as germanium and the Group III–Group V compounds.

What is claimed is:

1. A semiconductor device of the insulated gate field effect type characterized in that the insulated gate includes a dielectric film having at least two distinct layers, the innermost layer consisting entirely of silicon dioxide having a thickness of from about 100 A. to about 1000 A. and an outer layer consisting entirely of aluminum oxide having a thickness of from about 300 A. to about 1000 A.

2. A semiconductor device in accordance with claim 1 in which the silicon dioxide layer has a thickness of about 1000 A. and the aluminum oxide layer has a thickness of about 500 A.

References Cited

UNITED STATES PATENTS

| | | | |
|---|---|---|---|
| 3,334,281 | 8/1967 | Ditrick | 317—235 |
| 3,386,163 | 6/1968 | Brennemann et al. | 317—235 |

JERRY D. CRAIG, Primary Examiner

U.S. Cl. X.R.

117—200